(12) United States Patent
Minami et al.

(10) Patent No.: US 9,799,532 B2
(45) Date of Patent: Oct. 24, 2017

(54) CMP POLISHING SOLUTION AND POLISHING METHOD

(75) Inventors: Hisataka Minami, Hitachi (JP); Jin Amanokura, Hitachi (JP); Sou Anzai, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 13/510,273

(22) PCT Filed: Jan. 4, 2011

(86) PCT No.: PCT/JP2011/050012
§ 371 (c)(1),
(2), (4) Date: May 16, 2012

(87) PCT Pub. No.: WO2011/099313
PCT Pub. Date: Aug. 18, 2011

(65) Prior Publication Data
US 2012/0238094 A1    Sep. 20, 2012

(30) Foreign Application Priority Data
Feb. 15, 2010    (JP) .................................. 2010-030351

(51) Int. Cl.
*H01L 21/302* (2006.01)
*H01L 21/461* (2006.01)
(Continued)

(52) U.S. Cl.
CPC ........ *H01L 21/3212* (2013.01); *B24B 37/044* (2013.01); *C09G 1/02* (2013.01);
(Continued)

(58) Field of Classification Search
None
See application file for complete search history.

(56) References Cited

U.S. PATENT DOCUMENTS

| 4,944,836 A | 7/1990 | Beyer et al. |
| 6,527,622 B1 | 3/2003 | Brusic et al. |

(Continued)

FOREIGN PATENT DOCUMENTS

| JP | 2-278822 A | 11/1990 |
| JP | 11-121411 A | 4/1999 |

(Continued)

OTHER PUBLICATIONS

International Preliminary Report on Patentability, issued from the International Bureau, in counterpart International Application No. PCT/JP2011/050012, dated Sep. 27, 2012, pp. 1-5.

(Continued)

*Primary Examiner* — Stephanie Duclair
(74) *Attorney, Agent, or Firm* — Fitch Even Tabin & Flannery LLP

(57) ABSTRACT

The CMP polishing liquid of the invention comprises a metal salt containing at least one type of metal selected from the group consisting of metals of Groups 8, 11, 12 and 13, 1,2,4-triazole, a phosphorus acid, an oxidizing agent and abrasive grains. The polishing method of the invention comprises a step of polishing at least a palladium layer with an abrasive cloth while supplying a CMP polishing liquid between the palladium layer of a substrate having the palladium layer and the abrasive cloth, wherein the CMP polishing liquid comprises a metal salt containing at least one type of metal selected from the group consisting of metals of Groups 8, 11, 12 and 13, 1,2,4-triazole, a phosphorus acid, an oxidizing agent and abrasive grains.

22 Claims, 4 Drawing Sheets

(51) Int. Cl.
  *B44C 1/22* (2006.01)
  *C03C 15/00* (2006.01)
  *C03C 25/68* (2006.01)
  *C25F 3/00* (2006.01)
  *C09K 13/00* (2006.01)
  *H01L 21/321* (2006.01)
  *H01L 21/306* (2006.01)
  *B24B 37/04* (2012.01)
  *C09G 1/02* (2006.01)
  *C09K 3/14* (2006.01)
  *H01L 21/768* (2006.01)

(52) U.S. Cl.
  CPC .......... *C09K 3/1409* (2013.01); *C09K 3/1463* (2013.01); *H01L 21/30625* (2013.01); *H01L 21/32115* (2013.01); *H01L 21/7684* (2013.01)

(56) References Cited

U.S. PATENT DOCUMENTS

| | | |
|---|---|---|
| 2002/0039839 A1* | 4/2002 | Thomas et al. .............. 438/693 |
| 2003/0181142 A1* | 9/2003 | De Rege Thesauro et al. .............................. 451/36 |
| 2004/0266196 A1* | 12/2004 | De Rege Thesauro et al. .............................. 438/698 |
| 2005/0104048 A1 | 5/2005 | Thomas et al. |
| 2005/0178742 A1* | 8/2005 | Chelle et al. ................... 216/88 |
| 2005/0211950 A1* | 9/2005 | de Rege Thesauro et al. .............................. 252/79.1 |
| 2006/0030158 A1 | 2/2006 | Carter et al. |
| 2006/0086055 A1 | 4/2006 | Carter |
| 2006/0234509 A1 | 10/2006 | Small et al. |
| 2008/0254628 A1 | 10/2008 | Boggs et al. |
| 2009/0014415 A1 | 1/2009 | Chelle et al. |
| 2011/0177690 A1* | 7/2011 | Minami et al. .............. 438/693 |
| 2012/0024818 A1 | 2/2012 | Ono et al. |
| 2012/0160804 A1 | 6/2012 | Ono et al. |
| 2012/0238094 A1 | 9/2012 | Minami et al. |

FOREIGN PATENT DOCUMENTS

| | | | |
|---|---|---|---|
| JP | | 3192968 B2 | 7/2001 |
| JP | | 2005-117046 A | 4/2005 |
| JP | | 3780767 B2 | 5/2006 |
| JP | | 2006-519490 A | 8/2006 |
| JP | | 2006-297501 A | 11/2006 |
| JP | | 2007-531274 A | 11/2007 |
| JP | | 2008-034818 | * 2/2008 |
| JP | | 2009-503910 | 1/2009 |
| WO | WO | 00/39844 A1 | 7/2000 |
| WO | WO | 01/44396 A1 | 6/2001 |
| WO | WO | 03/038883 A1 | 5/2003 |
| WO | WO | 2005/100496 A2 | 10/2005 |
| WO | WO | 2010/016390 A1 | 2/2010 |

OTHER PUBLICATIONS

International Search Report in corresponding International Application PCT/JP2011/050012, dated Feb. 8, 2011, pp. 1-2.
F.B. Kaufman et al., "Chemical-Mechanical Polishing for Fabricating Patterned .W Metal Features as Chip Interconnects," J. Electrochem. Soc., vol. 138, No. 11, Nov. 1991, pp. 3460-3465.
Taiwanese Official Action dated Dec. 2, 2014, for TW Application No. 100100493.
Office Action from Republic of China, Taiwan Patent Office in the corresponding Patent Application No. 099103496 dated Feb. 21, 2015, 5 pages in Chinese.
Notification of Transmittal of Translation of the International Preliminary Report on Patentability, dated Feb. 16, 2012, in corresponding PCT Application No. PCT/JP2010/051671.
International Search Report for PCT/JP2010/051671 dated Apr. 27, 2010 (1 page).
Notice of Allowance dated Jan. 5, 2016, for Japanese Application No. 2013-247423.

* cited by examiner (a)

(b)

(c)

(d)

(e)

(a)

(b)

(a)

(b)

(a)

(b)

CMP POLISHING SOLUTION AND POLISHING METHOD

TECHNICAL FIELD

The present invention relates to a CMP polishing liquid and a polishing method.

BACKGROUND ART

New micromachining techniques are being developed in recent years for increasingly higher integration and higher performance of large-scale integrated circuit (LSI). One such technique is Chemical Mechanical Polishing (CMP), the technique is often used for flattening of interlayer dielectric film layer, formation of metal plug and formation of embedded wiring in LSI production step, particularly in multilayer wiring forming step (see Patent document 1, for example).

One micromachining technique that has been employed is the "damascene method", wherein a metal layer is accumulated on an insulating film having pre-formed trenches (recesses) and elevated sections (convexities) to embed the metal layer in the trenches, and then the metal layer accumulated on the elevated sections (the metal layer on sections other than the trenches) is removed by CMP to form embedded wiring (see Patent document 2, for example).

The common method of CMP for a metal layer involves attaching an abrasive cloth (abrasive pad) onto a circular polishing plate (platen), wetting the abrasive cloth surface with a polishing liquid, pressing the metal layer-formed surface of a base substrate against the abrasive cloth surface, rotating the polishing platen with a prescribed pressure (hereunder referred to as "polishing pressure") applied to the metal layer from the back side of the base substrate, and removing the metal layer on the elevated sections by mechanical friction between the polishing liquid and the metal layer on the elevated sections.

A polishing liquid to be used for CMP of metal commonly comprises an oxidizing agent and a solid abrasive, it further comprises a metal oxide solubilizer or protective film-forming agent (metal corrosion preventing agent) as necessary. The basic mechanism of CMP employing a polishing liquid comprising an oxidizing agent is considered to be that, first, the metal layer surface is oxidized by the oxidizing agent to form an oxidation layer, and the metal layer is polished by shaving the oxidation layer with the solid abrasive.

In this polishing method, the oxidation layer at the surface of the metal layer accumulated on the elevated sections contacts with the abrasive cloth, and therefore shaving proceeds, whereas the oxidation layer at the surface of the metal layer that has accumulated on trenches only minimally contacts with the abrasive cloth, and is therefore not reached by the shaving effect of the solid abrasive. As CMP proceeds, therefore, the metal layer on the convexities is removed to flatten the substrate surface (see Non-patent document 1, for example).

It is known that constituent components for a CMP polishing liquid are different depending on the substance to be polished. For example, as a CMP polishing liquid wherein object to be polished is a layer composed of titanium nitride or tantalum nitride formed on substrates, a polishing liquid comprising protective film-forming agents and organic acids is known (see Patent document 3, for example).

Also, as a CMP polishing liquid to be applied for a layer composed of copper, for example, a polishing liquid comprising 2-quinolinecarboxylic acid is known (see Patent document 4, for example). As a CMP polishing liquid to be applied for a layer composed of nickel, for example, a CMP polishing liquid for HDD magnetic heads comprising abrasives, an organic acid and an oxidizing agent is also known (see Patent document 5, for example).

CITATION LIST

Patent Literature

[Patent document 1] U.S. Pat. No. 4,944,836
[Patent document 2] Japanese Unexamined Patent Application Publication BEI No. 2-278822
[Patent document 3] Japanese Patent Publication No. 3780767
[Patent document 4] Japanese Patent Publication No. 3192968
[Patent document 5] Japanese Unexamined Patent Application Publication No. 2006-297501
[Patent Document 6] International Patent Publication No. WO01/44396
[Patent document 7] U.S. Pat. No. 6,527,622
[Patent document 8] Japanese Unexamined Patent Application Publication HEI No. 11-121411
[Patent Document 9] International Patent Publication No. WO05/100496

Non Patent Literature

[Non-patent document 1] Journal of Electrochemical Society, Vol. 138, No. 11 (1991), p. 3460-3464

SUMMARY OF INVENTION

Technical Problem

Incidentally, LSI structures have become even more diverse in recent years, and the metals employed therein are also diversifying. Therefore, satisfactory polishing rate for various metals is required for a CMP polishing liquid used for manufacturing of LSI.

For example, in a mounting system that uses wire bonding, efforts are being made in recent years to employ copper wires instead of the conventionally used gold wires, with the aim of achieving cost reduction. In this case, the use of a palladium layer (or a palladium alloy layer) in a bonding pad is also being investigated for improved reliability.

For high integration of semiconductor elements, multi-pin, narrow-pitch and thin-mounted designs are being required. Wiring delay and noise prevention between semiconductor elements and circuit boards have also become significant issues. A connecting system for semiconductor elements and circuit boards therefore widely employs a flip-chip mounting system in place of a wire bonding-based mounting system.

For a flip-chip mounting system, it is common to use solder bump connection methods in which bump electrodes are formed on the electrode terminals of a semiconductor element, and semiconductor elements are bonded en bloc through the bump electrodes onto connecting terminals formed on a circuit board. In such flip-chip mounting system as well, providing a palladium layer (or palladium alloy layer) at the bump electrode sections are being studied.

Palladium is generally classified as a "noble metal", together with platinum and ruthenium. Examples of known CMP polishing liquids applied to a noble metal layer include a CMP polishing liquid containing a sulfur compound, a CMP polishing liquid containing a diketone, nitrogen-containing heterocyclic compound or amphoteric ion compound, and a CMP polishing liquid containing a platinum family metal oxide (see Patent documents 6, 7 and 8, for example). Polishing liquids known for polishing of a noble metal such as platinum include a polishing liquid that contains no special oxidizing agent or chemical etchant, comprising alumina as the abrasive material (abrasive grains), and comprising at least one metal ion selected from the group consisting of calcium, strontium, barium, magnesium, zinc and their mixtures (see Patent document 9, for example).

However, since polishing of a palladium layer by CMP has not yet been thoroughly investigated, the aforementioned wire bonding mounting system and flip-chip mounting system have not been practically used on a large scale. Findings by the present inventors have indicated that, because a palladium layer is poorly-oxidized and hard, it is very difficult to polish a palladium layer using the polishing liquids of Patent documents 3, 4 and 5. It has also been found that, while a platinum layer and a ruthenium layer can be polished with the polishing liquids of Patent documents 6, 7 and 8 which are designed for polishing of a noble metal, polishing does not adequately proceed when a palladium layer is polished using the same polishing liquids. Furthermore, while platinum can be polished with the polishing liquid of Patent document 9, polishing does not adequately proceed when a palladium layer is polished using the same polishing liquid.

It is therefore an object of the present invention to provide a CMP polishing liquid and a polishing method that can improve the polishing rate for at least a palladium layer, compared to using conventional CMP polishing liquids.

The combined use of a palladium layer and a nickel layer in a bonding pad for a wire bonding mounting system is also being investigated. In addition, a nickel layer is sometimes provided as an under barrier metal layer between a palladium layer and an insulating film layer, in a flip-chip mounting system. In these cases, it is considered necessary to use a CMP polishing liquid that allows not only polishing of the palladium layer but also polishing of the nickel layer.

It is therefore another object of the present invention to provide a CMP polishing liquid and a polishing method that can improve the polishing rate for at least a palladium layer and a nickel layer, compared to using conventional CMP polishing liquids.

In a flip-chip mounting system, a metal layer such as a tantalum layer, ruthenium layer, titanium layer or cobalt layer is sometimes provided as an underlying metal layer between a palladium layer and an insulating film layer. In such cases, it is considered necessary to use a CMP polishing liquid that allows not only polishing of the palladium layer but also polishing of the metal layer used as the underlying metal layer.

It is therefore yet another object of the invention to provide a CMP polishing liquid and a polishing method that allow polishing of at least a palladium layer and a metal layer used as an underlying metal layer, while also improving the polishing rate for a palladium layer, compared to using conventional CMP polishing liquids.

Solution to Problem

The present invention provides a CMP polishing liquid comprising a metal salt containing at least one type of metal selected from the group consisting of metals of Groups 8, 11, 12 and 13, 1,2,4-triazole, a phosphorus acid, an oxidizing agent and abrasive grains.

The CMP polishing liquid of the invention can improve the polishing rate for at least a palladium layer, compared to using conventional CMP polishing liquids, allowing polishing to be accomplished at the desired polishing rate. This property is markedly superior to the properties obtained using the CMP polishing liquids specifically disclosed in International Patent Publication No. WO2003/038883, International Patent Publication No. WO2000/039844 and elsewhere.

The CMP polishing liquid of the invention can also improve the polishing rate for a nickel layer, as well as the polishing rate for a palladium layer, compared to conventional CMP polishing liquids that contain no metal salt. The CMP polishing liquid of the invention furthermore can improve the polishing rate for a palladium layer, compared to conventional CMP polishing liquids, while also allowing polishing of a metal layer used as an underlying metal layer (for example, a ruthenium layer, a tantalum layer, a titanium layer and a cobalt layer) at satisfactory polishing rate.

Unless otherwise specified, the term "palladium layer" as used according to the invention includes not only a layer consisted of palladium, but also a layer consisted of a palladium-containing metal (such as palladium alloys, or other palladium compounds).

Unless otherwise specified, the term "nickel layer" as used according to the invention includes not only a layer consisted of nickel but also a layer consisted of a nickel-containing metal (such as nickel alloys, or other nickel compounds).

Unless otherwise specified, the term "ruthenium layer" as used according to the invention includes not only a layer consisted of ruthenium, but also a layer consisted of a ruthenium-containing metal (such as ruthenium alloys, or other ruthenium compounds).

Unless otherwise specified, the term "tantalum layer" as used according to the invention includes not only a layer consisted of tantalum but also a layer consisted of a tantalum-containing metal (for example, tantalum nitrides, tantalum alloys, and other tantalum compounds).

Unless otherwise specified, the term "titanium layer" as used according to the invention includes not only a layer consisted of titanium, but also a layer consisted of a titanium-containing metal (such as titanium nitrides, titanium alloys, and other titanium compounds).

Unless otherwise specified, the term "cobalt layer" as used according to the invention includes not only a layer consisted of cobalt, but also a layer consisted of a cobalt-containing metal (such as cobalt nitrides, cobalt alloys, and other cobalt compounds).

Unless otherwise specified, the term "M alloy (M representing a metal)" as used according to the invention refers to an alloy wherein the proportion of the metal M in the alloy is 50 mol % or greater. For example, "palladium alloy" refers to an alloy wherein the proportion of palladium in the alloy is 50 mol % or greater.

The CMP polishing liquid of the invention preferably comprises at least one type selected from the group consisting of hydrogen peroxide, periodic acid, periodic acid salts, iodic acid salts, bromic acid salts and persulfuric acid salts, as the oxidizing agent. This can further improve the polishing rate for a palladium layer and a nickel layer, while also providing a satisfactory polishing rate for a metal layer used as an underlying metal layer.

The abrasive grains preferably include at least one type selected from the group consisting of alumina, silica, zirconia, titania and ceria.

The content of the abrasive grains is preferably 0.1-10 mass % based on the total mass of the CMP polishing liquid. If the content of the abrasive grains in the CMP polishing liquid is within this range, a shaving effect can be maintained at a high level while aggregated sedimentation of the particles can be inhibited.

The CMP polishing liquid of the invention may be a CMP polishing liquid for polishing of a palladium layer.

The invention further provides a polishing method comprising a step of polishing at least a palladium layer with an abrasive cloth while supplying a CMP polishing liquid between the palladium layer of a substrate having the palladium layer and the abrasive cloth, wherein the CMP polishing liquid comprises a metal salt containing at least one type of metal selected from the group consisting of metals of Groups 8, 11, 12 and 13, 1,2,4-triazole, a phosphorus acid, an oxidizing agent and abrasive grains.

The polishing method of the invention can improve the polishing rate for at least a palladium layer, compared to using conventional CMP polishing liquids, allowing polishing to be accomplished at the desired polishing rate.

In addition, the polishing method of the invention can also improve the polishing rate for a nickel layer as well as the polishing rate for a palladium layer, compared to using conventional CMP polishing liquids that contain no metal salt. According to the polishing method of the invention, it is possible to improve the polishing rate for a palladium layer, compared to using conventional CMP polishing liquids, while also allowing polishing of a metal layer used as an underlying metal layer to be accomplished at satisfactory polishing rate. Therefore, according to the polishing method of the invention, a nickel layer and an underlying metal layer in addition to a palladium layer of a substrate having these layers can be polished using the CMP polishing liquid described above in a single polishing step.

In the polishing method of the invention, the CMP polishing liquid preferably comprises at least one type selected from the group consisting of hydrogen peroxide, periodic acid, periodic acid salts, iodic acid salts, bromic acid salts and persulfuric acid salts, as the oxidizing agent.

The abrasive grains used in the polishing method of the invention preferably include at least one type selected from the group consisting of alumina, silica, zirconia, titania and ceria.

The content of the abrasive grains for the polishing method of the invention is preferably 0.1-10 mass % based on the total mass of the CMP polishing liquid. If the content of the abrasive grains in the CMP polishing liquid is within this range, a shaving effect can be maintained at a high level while aggregated sedimentation of the particles can be inhibited.

Advantageous Effects of Invention

According to the invention, it is possible to provide a CMP polishing liquid and a polishing method that can improve the polishing rate for at least a palladium layer, compared to using conventional CMP polishing liquids, allowing polishing to be accomplished at the desired polishing rate.

Also according to the invention, it is possible to provide a CMP polishing liquid and a polishing method that can improve the polishing rate for at least a palladium layer and a nickel layer, compared to using conventional CMP polishing liquids.

Furthermore, according to the invention, it is possible to provide a CMP polishing liquid and a polishing method that allow polishing of at least a palladium layer and a metal layer used as an underlying metal layer, while also improving the polishing rate for a palladium layer, compared to using conventional CMP polishing liquids.

DESCRIPTION OF EMBODIMENTS

Figure 1:
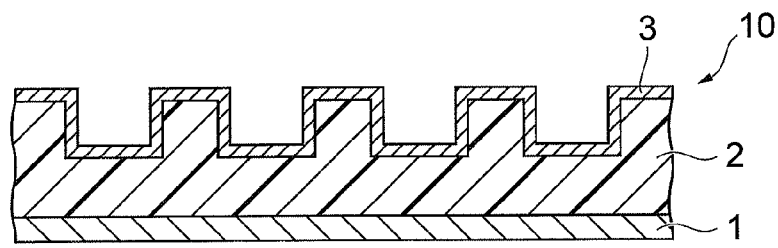
FIG. 1 is a cross-sectional view showing a first embodiment of a method for producing a substrate with bump electrodes.
Figure 1:
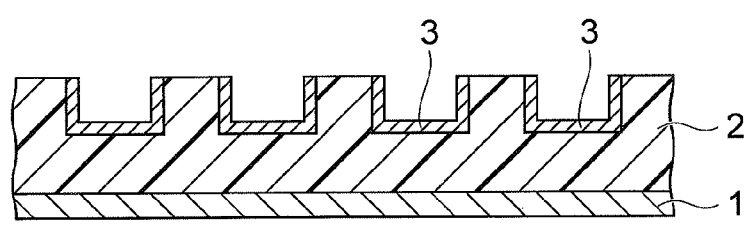
Figure 1:
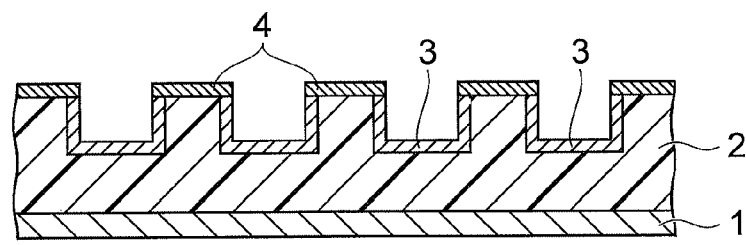
Figure 1:
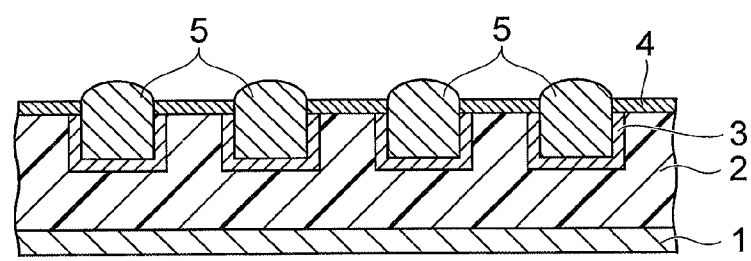
Figure 1:
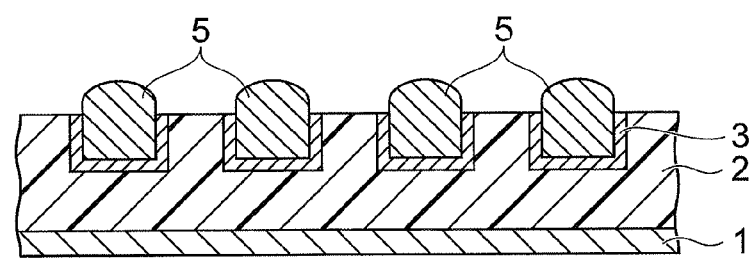

Embodiments for carrying out the invention will now be explained in further detail. The CMP polishing liquid of this embodiment comprises a metal salt, 1,2,4-triazole, a phosphorus acid, an oxidizing agent and abrasive grains.

(Metal Salt)

The metal salt is a metal salt containing at least one type of metal selected from the group consisting of metals of Groups 8, 11, 12 and 13. The metal salt is preferably a metal salt containing at least one type of metal selected from the group consisting of metals of Groups 8 and 13. These metal salts may also be hydrates. The metal salt ionizes in the CMP polishing liquid, producing a metal ion which has the effect of improving the polishing rate for a palladium layer and a nickel layer.

The metal salt is therefore preferably dissolved in the CMP polishing liquid.

A metal salt containing a metal of Group 8 is preferably a metal salt containing iron. More preferred example of a metal salt containing iron includes iron(II) chloride, iron(III) chloride, iron(II) nitrate, iron(III) nitrate, iron(II) sulfate, iron(III) sulfate, iron(II) acetate, iron(II) lactate, iron(II) oxalate, iron(III) oxalate, potassium hexacyanoferrate(II) and potassium hexacyanoferrate(III), with iron(II) nitrate and iron(II) sulfate being even more preferred.

A metal salt containing a metal of Group 11 is preferably a metal salt containing at least one type of metal selected from the group consisting of copper and silver. More preferred example of a metal salt containing copper includes copper(I) chloride, copper(II) chloride, copper(II) nitrate, copper(II) sulfate, copper(II) acetate, copper(II) lactate, copper(II) oxalate, copper(II) tartrate and copper(II) benzoate, with copper(II) nitrate and copper(II) sulfate being even more preferred. More preferred example of a metal salt containing silver includes silver chloride, silver nitrate and silver sulfate, with silver nitrate being even more preferred.

A metal salt containing a metal of Group 12 is preferably a metal salt containing zinc. More preferred example of a metal salt containing zinc includes zinc chloride, zinc nitrate, zinc sulfate, zinc acetate and zinc lactate, with zinc nitrate, zinc sulfate and zinc acetate being even more preferred.

A metal salt containing a metal of Group 13 is preferably a metal salt containing at least one type of metal selected from the group consisting of aluminum and gallium. More preferred example of a metal salt containing aluminum includes aluminum chloride, aluminum nitrate, aluminum sulfate, aluminum acetate, aluminum lactate, potassium aluminum alum, ammonium aluminum alum, potassium aluminate and sodium aluminate, with aluminum nitrate, aluminum sulfate, aluminum lactate, potassium aluminum alum, ammonium aluminum alum and potassium aluminate being even more preferred. More preferred example of a metal salt containing gallium includes gallium chloride, gallium nitrate and gallium sulfate, with gallium nitrate being even more preferred.

Preferred among these are metal salts that can dissolve in water. Among these metal salts, a metal salt other than chlorides and sodium salts is preferred from the viewpoint of preventing corrosion on the metal layer. A single metal salt may be used alone, or two or more may be used in admixture. When the CMP polishing liquid contains a metal phosphate as the phosphorus acid, described hereunder, the metal salt containing at least one type of metal selected from the group consisting of metals of Groups 8, 11, 12 and 13 is preferably a metal salt other than a metal phosphate.

The content of the metal salt is preferably such that the metal ion content is $1 \times 10^{-5}$-10 mol per 1 kg of CMP polishing liquid. If the metal ion content is $1 \times 10^{-5}$ mol or greater, it will be possible to obtain an even more satisfactory polishing rate for a palladium layer and a nickel layer. From this viewpoint, the lower limit for the metal ion content is more preferably $5 \times 10^{-5}$ mol or greater, even more preferably $1 \times 10^{-4}$ mol or greater, and extremely preferably $2 \times 10^{-4}$ mol or greater. If the metal ion content is not greater than 10 mol, it will be possible to inhibit saturation of the polishing rate for a palladium layer and a nickel layer with respect to the metal ion content. From this viewpoint, the upper limit for the metal ion content is more preferably 8 mol or less, even more preferably 6 mol or less, and extremely preferably 5 mol or less.

1,2,4-Triazole

The CMP polishing liquid comprises 1,2,4-triazole as a complexing agent. A complexing agent is a substance that can coordinate with a metal to form a complex. The compound 1,2,4-triazole is believed to form a complex with palladium, similarly to the phosphorus acid described below, and presumably the formed complex is easily polished and thereby results in a satisfactory polishing rate. Although it can be imagined that nitrogen-containing compounds can form complexes with palladium, but according to research by the present inventors, the polishing rate for a palladium layer cannot be improved with compounds other than 1,2,4-triazole. For example, it is difficult to achieve a satisfactory polishing rate for a palladium layer when 1,2,3-triazole having similar structure to 1,2,4-triazole, and 3-amino-1,2,4-triazole are used instead of 1,2,4-triazole.

The content of 1,2,4-triazole is preferably 0.001-20 mass % based on the total mass of the CMP polishing liquid. If the content is at least 0.001 mass %, the polishing rate for a palladium layer by CMP will tend to be further improved. From this standpoint, the lower limit for the content of 1,2,4-triazole is more preferably 0.01 mass % or greater, and even more preferably 0.05 mass % or greater. The content of 1,2,4-triazole of not greater than 20 mass % will tend to inhibit saturation of the polishing rate for a palladium layer with respect to the content of 1,2,4-triazole. From this standpoint, the upper limit for the content of 1,2,4-triazole is more preferably 15 mass % or less, even more preferably 12 mass % or less, and extremely preferably 10 mass % or less.

(Phosphorus Acid)

The CMP polishing liquid comprises a phosphorus acid. A phosphorus acid can promote polishing of a metal layer by complexing with and/or dissolving a metal that has been oxidized by an oxidizing agent described below, and it is presumed to function as a metal oxide solubilizer for palladium.

It is imagined that compounds that function as metal oxide solubilizers for palladium include various inorganic acids and organic acids, but according to research by the present inventors, it is difficult to obtain a satisfactory polishing rate for a palladium layer with acids other than a phosphorus acid.

A phosphorus acid is phosphoric acid and the group of analogous compounds that comprise a phosphoric acid backbone (phosphoric acid, phosphorous acid and hypophosphorous acid, as well as their condensates), and it also includes a salt thereof. Specific examples of a phosphorus acid includes phosphoric acid, hypophosphoric acid, phosphorous acid, hypophosphorous acid, pyrophosphoric acid, trimetaphosphoric acid, tetrametaphosphoric acid, tetrametaphosphoric acid, hexametaphosphoric acid, pyrophosphorous acid, polyphosphoric acid, tripolyphosphoric acid, and the like. Examples of a salt of a phosphorus acid include a salt of a cation and a phosphorus acid anion, including a metal phosphate such as iron(II) phosphate, copper(II) phosphate, zinc phosphate and aluminum phosphate. Examples of a cation include lithium, sodium, potassium, rubidium, cesium, beryllium, magnesium, calcium, strontium, barium, titanium, zirconium, vanadium, chromium, manganese, iron, cobalt, nickel, copper, silver, palladium, zinc, aluminum, gallium, tin and ammonium ions, and the like. Examples of a phosphorus acid anion include phosphate ion, phosphite ion, hypophosphite ion, pyrophosphate ion, pyrophosphite ion, trimetaphosphate ion, tetrametaphosphate ion, hexametaphosphate ion, polyphosphate ion, tripolyphosphate ion, condensed phosphate ions and the like. A salt of a phosphorus acid may be primary salts having one metal and two hydrogens, secondary salts having two metals and one hydrogen, or tertiary salts having three metals, and it may be an acidic salt, an alkaline salt or a neutral salt. Any of these phosphorus acids may be used alone or in combinations of two or more.

The content of the phosphorus acid is preferably 0.001-20 mass % based on the total mass of the CMP polishing liquid. If the content of the phosphorus acid is at least 0.001 mass %, the polishing rate for a palladium layer, nickel layer and underlying metal layer by CMP will tend to be further improved. From this standpoint, the lower limit for the content of the phosphorus acid is more preferably 0.01 mass % or greater, and even more preferably 0.02 mass % or greater. Also, if the content of the phosphorus acid is not greater than 20 mass %, this will prevent saturation of the polishing rate for a palladium layer with respect to the content of the phosphorus acid. From this standpoint, the upper limit for the content of the phosphorus acid is more preferably 15 mass % or less, and even more preferably 10 mass % or less.

As mentioned above, a phosphorus acid may be a salt of a cation and a phosphorus acid anion, where the cation may be a metal ion. In this case, the metal ion as the cation of the phosphorus acid salt can also serve as a metal ion contributing to the polishing rate for a palladium layer. Thus, when a metal salt of at least one metal selected from the group consisting of metals of Groups 8, 11, 12 and 13 is used as the phosphorus acid, the content of the phosphorus acid and the content of the metal ion preferably satisfy the ranges specified above.

(Oxidizing Agent)

The oxidizing agent in the CMP polishing liquid is an oxidizing agent for a metal used to form a layer on a base substrate. The oxidizing agent used may be one that is known as an oxidizing agent capable of oxidizing metals. Specifically, the oxidizing agent is preferably one or more types selected from the group consisting of hydrogen peroxide ($H_2O_2$), periodic acid, periodic acid salts, iodic acid salts, bromic acid salts and persulfuric acid salts, among which hydrogen peroxide is more preferred from the viewpoint of obtaining a more satisfactory polishing rate. Periodic acid salts, iodic acid salts, bromic acid salts and persulfuric acid salts may be ammonium salts or potassium salts. Any of these oxidizing agents may be used alone or in mixtures of two or more.

When the base substrate (substrate) is a silicon substrate comprising an integrated circuit element, an oxidizing agent containing no non-volatilizing components is preferred from the standpoint of preventing contamination by alkali metals, alkaline earth metals, halides and the like. However, when the base substrate used is a glass substrate and the like, containing no semiconductor element, it may be an oxidizing agent containing non-volatilizing components.

The content of the oxidizing agent is preferably 0.05-20 mass % based on the total mass of the CMP polishing liquid. If the content of the oxidizing agent is at least 0.05 mass %, the metal will be sufficiently oxidized and the polishing rate for a palladium layer will tend to be further improved, and when polishing of a nickel layer or an underlying metal layer is also necessary, their polishing rates will also tend to be further improved. From this viewpoint, the content of the oxidizing agent is more preferably 0.1 mass % or greater. The content of the oxidizing agent of not greater than 20 mass % will tend to prevent roughening of the polished surface. From this standpoint, the content of the oxidizing agent is more preferably not greater than 15 mass %, and even more preferably not greater than 10 mass %.

(Abrasive Grains)

The abrasive grains may be, specifically, silica such as fumed silica or colloidal silica, alumina such as fumed alumina or transitional alumina, zirconia, titania, ceria or the like, among which alumina and silica are preferred, with silica being more preferred and colloidal silica being even more preferred from the standpoint of inhibiting formation of scratches while maintaining a high polishing rate. Any of these abrasive grains may be used alone or in mixtures of two or more.

The content of the abrasive grains is preferably 0.1-10 mass % based on the total mass of the CMP polishing liquid. If the content of the abrasive grains is 0.1 mass % or greater, the physical shaving effect will tend to be further increased, and therefore the polishing rate by CMP will tend to be greater. From this viewpoint, the content of the abrasive grains is more preferably 0.2 mass % or greater. Also, if the content of the abrasive grains is not greater than 10 mass %, aggregated sedimentation of the particles will tend to be inhibited. From this viewpoint, the content of the abrasive grains is more preferably not greater than 8 mass %. Even if the CMP polishing liquid contains the abrasive grains in an amount of greater than 10 mass %, the polishing rate will tend not to be increased commensurately with the content. This tendency is seen more notably on the polishing rate for a palladium layer.

The mean primary particle size of the abrasive grains is preferably not greater than 300 nm, more preferably not greater than 200 nm, even more preferably not greater than 150 nm and extremely preferably not greater than 100 nm, from the viewpoint of flatness and of preventing scratches remaining on the polished surface after polishing. There are no particular restrictions on the lower limit of the mean primary particle size, but from the viewpoint of further improving the physical shaving effect, it is preferably 1 nm or greater, more preferably 3 nm or greater, and even more preferably 5 nm or greater.

The "mean primary particle size" is the mean diameter of particles that can be calculated from the BET specific surface area, and it is calculated from the following formula (1) based on measurement of the adsorption specific surface area (hereunder referred to as "BET specific surface area") by a gas adsorption method.

$$D1 = 6/(\rho \times V) \tag{1}$$

In formula (1), D1 represents the mean primary particle size (units: m), $\rho$ represents the particle density (units: kg/m$^3$) and V represents the BET specific surface area of the particles (units: m$^2$/g).

More specifically, the abrasive grains are first dried with a vacuum freeze drier, and the residue is finely crushed with a mortar (magnetic, 100 ml) to prepare a measuring sample. Next, the BET specific surface area V of the measuring sample is measured using a BET specific surface area measuring apparatus (product name: AUTOSORB 6) by Yuasa-Ionics, Inc., and the primary particle size D1 (units: m) is calculated from formula (1) above. When the particles are colloidal silica, the density $\rho$ of the particles is "$\rho$=2200 (kg/m$^3$)". By thus measuring the BET specific surface area V (m$^2$/g), it is possible to calculate the primary particle size D1 based on the following formula (2).

$$\begin{aligned} D1 &= 2.727 \times 10^{-6}/V \text{ (m)} \\ &= 2727/V \text{ (nm)} \end{aligned} \tag{2}$$

The mean secondary particle size of the abrasive grains is preferably 5-500 nm. From the standpoint of improving the flatness, the upper limit for the mean secondary particle size is more preferably not greater than 300 nm, even more preferably not greater than 200 nm, and extremely preferably not greater than 100 nm. Also, from the standpoint of ensuring sufficient mechanical ability to remove the reaction layer (oxidized layer) by the abrasive grains, and therefore further increasing the polishing rate, the lower limit for the mean secondary particle size is more preferably 7 nm or greater.

The "mean secondary particle size" is the mean secondary particle size of the abrasive grains in the CMP polishing liquid, and it can be measured, for example, using an optical diffraction scattering particle size distribution meter (for example, COULTER N4SD by Coulter Electronics).

(Metal Corrosion Preventing Agent)

The CMP polishing liquid may further comprise a metal corrosion preventing agent. A metal corrosion preventing agent is a compound that inhibits etching of a metal layer and improves the anti-dishing property.

Specific examples of the metal corrosion preventing agent include imines, azoles (excluding 1,2,4-triazole) and mercaptanes. From the viewpoint of achieving a greater effect of both minimizing the etching rate for a metal layer and improving the polishing rate for a metal layer, a nitrogen-containing cyclic compound is preferred among the aforementioned metal corrosion preventing agents. Any of these metal corrosion preventing agents may be used alone or in combinations of two or more.

Specifically, imines include dithizone, Cuproine (2,2'-biquinoline), Neocuproine (2,9-dimethyl-1,10-phenanthroline), Bathocuproin (2,9-dimethyl-4,7-diphenyl-1,10-phenanthroline), Cuperazone (biscyclohexanoneoxalylhydrazone) and the like.

Specifically, azoles include benzimidazole-2-thiol, triazinedithiol, triazinetrithiol, 2-[2-(benzothiazolyl)]thiopropionic acid, 2-[2-(benzothiazolyl)]thiobutyric acid, 2-mercaptobenzothiazole, 1,2,3-triazole, 2-amino-1H-1,2,4-triazole, 3-amino-1H-1,2,4-triazole, 3,5-diamino-1H-1,2,4-triazole, benzotriazole, 1-hydroxybenzotriazole, 1-dihydroxypropyl-benzotriazole, 2,3-dicarboxypropylbenzotriazole, 4-hydroxybenzotriazole, 4-carboxyl-1H-benzotriazole, 4-carboxyl-1H-benzotriazolemethyl ester, 4-carboxyl-1H-benzotriazole butyl ester, 4-carboxyl-1H-benzotriazole octyl ester, 5-hexylbenzotriazole, [1,2,3-benzotriazolyl-1-methyl][1,2,4-triazolyl-1-methyl][2-ethylhexyl]amine, tolyltriazole, naphthotriazole, bis[(1-benzotriazolyl)methyl]phosphonic acid, tetrazole, 5-amino-tetrazole, 5-methyl-tetrazole, 1-methyl-5-mercaptotetrazole, 1-N,N-dimethylaminoethyl-5-tetrazole and the like.

Specifically, mercaptanes include nonylmercaptane and dodecylmercaptane.

When the CMP polishing liquid comprises a metal corrosion preventing agent, the content of the metal corrosion preventing agent is preferably in a range that does not impair the effect of improving the polishing rate by the 1,2,4-triazole and phosphorus acid, and it is preferably 0.005-2.0 mass % based on the total mass of the CMP polishing liquid, from the viewpoint of achieving a greater effect of both preventing etching and improving the polishing rate. From the viewpoint of obtaining even higher etching performance, the content of the metal corrosion preventing agent is more preferably 0.01 mass % or greater, and even more preferably 0.02 mass % or greater. From the viewpoint of more easily obtaining a favorable polishing rate, the content of the metal corrosion preventing agent is more preferably not greater than 1.0 mass %, and even more preferably not greater than 0.5 mass %.

(Water-Soluble Polymer)

The CMP polishing liquid may further comprise a water-soluble polymer, from the viewpoint of improving the flatness after polishing. From this standpoint, the weight-average molecular weight of the water-soluble polymer is preferably 500 or greater, more preferably 1500 or greater, and even more preferably 5000 or greater. There is no particular restriction on the weight-average molecular weight of the water-soluble polymer, but it is preferably not greater than 5 million from the viewpoint of obtaining excellent solubility. On the other hand, it will tend to be difficult to obtain high polishing rate if the weight-average molecular weight is less than 500.

The weight-average molecular weight may be measured by gel permeation chromatography (GPC), using a standard polystyrene calibration curve, and more specifically, it may be measured under the following conditions.

Device: Hitachi Model L-6000 [product of Hitachi, Ltd.]
Column: GL-R420 Gel pack+GL-R430 Gel pack+GL-R440 Gel pack (total of 3, by Hitachi Chemical Co., Ltd.)
Eluent: Tetrahydrofuran
Measuring temperature: 40° C.
Flow rate: 1.75 ml/min.
Detector: L-3300R1 [Hitachi, Ltd.]

The water-soluble polymer with a weight-average molecular weight of 500 or greater is not particularly restricted so long as there is no reduction in solubility of the components in the CMP polishing liquid and there is no immediate aggregation of the abrasive grains, and specific ones include polysaccharides, polycarboxylic acid compounds, vinyl polymers, polyethers and the like. Any of these may be used alone or in mixtures of two or more. The water-soluble polymer may be a homopolymer consisting of a single monomer, or a copolymer comprising two or more monomers.

Examples of polysaccharides to be used as the water-soluble polymers include alginic acid, pectic acid, carboxymethyl cellulose, agar, curdlan, pullulan and the like.

Examples of polycarboxylic acid compounds to be used as the water-soluble polymers include polyacrylic acid compounds and salts thereof, polycarboxylic acids and salts thereof, polycarboxylic acid esters and salts thereof, and copolymers of the foregoing.

The term "polyacrylic acid compound" is defined as a polymer compound obtained by polymerization of a starting material comprising a monomer with an acrylic acid backbone, and it may be a homopolymer of a monomer with an acrylic acid backbone, or a copolymer of different monomers with acrylic acid backbones. It may also be a copolymer of a monomer with an acrylic acid backbone and another polymerizable monomer.

Specific examples of "polyacrylic acid compounds" and salts thereof include homopolymers of polyacrylic acid, ammonium polyacrylate, sodium polyacrylate, polymethacrylic acid, ammonium polymethacrylate, sodium polymethacrylate, polyacrylamide and aminopolyacrylamide; copolymers such as acrylic acid-methacrylic acid copolymer, acrylic acid-acrylic acid ester copolymer and acrylic acid-acrylamide copolymer; ammonium salts of these copolymers. When the "polyacrylic acid compound" is a salt, all of the carboxylic acid may form the salt, or only a portion of the carboxylic acid may form the salt.

Specific examples of polycarboxylic acid and salts thereof include polyaspartic acid, polyglutamic acid, polylysine, polymalic acid, polyamic acid, ammonium polyamidate, sodium polyamidate, polymaleic acid, polyitaconic acid, polyfumaric acid, poly(p-styrenecarboxylic acid), polyglyoxylic acid and the like.

Examples of vinyl polymers to be used as the water-soluble polymer include polyvinyl alcohol, polyvinylpyrrolidone, polyacrolein and the like. A polyether used as the water-soluble polymer may be polyethylene glycol and the like.

When the water-soluble polymer compound is used and the base substrate is a silicon substrate for a semiconductor integrated circuit or the like, it is preferably an acid or its ammonium salt from the viewpoint of preventing contamination by alkali metals, alkaline earth metals, halides or the like. This restriction does not apply, however, when the base substrate is a glass substrate or the like.

When the CMP polishing liquid comprises a water-soluble polymer, the content of the water-soluble polymer is preferably not greater than 5 mass %, and more preferably not greater than 2 mass %, based on the total mass of the CMP polishing liquid. If the content is not greater than 5 mass %, it will be possible to inhibit aggregation of the abrasive grains.

(Water)

The CMP polishing liquid may comprise water. There are no particular restrictions on the water, but deionized water, ion-exchanged water or ultrapure water is preferred. The content of water in the CMP polishing liquid may consist of the remainder after the content of the constituent components. The CMP polishing liquid may further comprise a solvent other than water, if necessary, which may be a polar solvent such as ethanol, glycol, acetone or an ester.

(pH)

The pH of the CMP polishing liquid is preferably not less than 1 and not greater than 12, from the viewpoint of further improving the CMP polishing rate for a palladium layer. In order to help ensure the prescribed CMP polishing rate and obtain a further practical CMP polishing liquid, the upper limit for the pH of the CMP polishing liquid is more preferably not greater than 6, even more preferably not greater than 5, extremely preferably not greater than 4, and especially preferably less than 3.

The pH of the CMP polishing liquid can be measured using a pH meter (for example, a Model PHL-40 by DKK Corp.). The measured pH value that is used may be obtained by placing an electrode in the CMP polishing liquid after 2-point calibration using standard buffer (phthalate pH buffer: pH 4.01 (25° C.), neutral phosphate pH buffer: pH 6.86 (25° C.)), and by measuring the value upon stabilization after an elapse of 2 minutes or more.

(Preparation Method and Usage of CMP Polishing Liquid)

CMP polishing liquids comprising combinations of the aforementioned components may be classified into (A) normal types, (B) concentrated types and (C) two-pack types for example, and the preparation method and usage differ according to the type. The (A) normal types are polishing liquids that can be used directly without pretreatment such as dilution during polishing, merely with addition of an oxidizing agent. The (B) concentrated types are polishing liquids in which the components are more concentrated than in (A) normal types, for convenience of storage and transport. The (C) two-pack types are polishing liquids that are separated into a liquid A containing some components and liquid B containing other components during storage and transport, the liquid A and liquid B being mixed at the time of use.

A (A) normal types can be obtained by dissolving or dispersing the metal salt, 1,2,4-triazole, phosphorus acid, abrasive grains, and other components as necessary, in water as the main dispersing medium. For example, to prepare 900 g of a polishing liquid with a metal salt content of 0.005 part by mass, a 1,2,4-triazole content of 0.5 part by mass, a phosphorus acid content of 5 parts by mass and an abrasive grain content of 10 parts by mass, with respect to 100 parts by mass of the polishing liquid, the amounts may be adjusted to 5 g of 1,2,4-triazole, 50 g of phosphoric acid, 0.05 g of the metal salt, 100 g of abrasive grains and the remainder water, based on 900 g of the total amount of the polishing liquid. An oxidizing agent (such as hydrogen peroxide) may be added beforehand for use. For an oxidizing agent content of 3 parts by mass, the preparation is carried out by mixing 100 g of 30 mass % hydrogen peroxide water with 900 g of the polishing liquid.

A (B) concentrated type is diluted with water immediately before use so as to achieve the desired contents of the constituent components, and an oxidizing agent is added. After dilution, it may be stirred for any period of time, until the same liquid properties (for example, pH or abrasive grain particle size) and polishing properties (for example, polishing rate of palladium film) are obtained as an (A) normal type. With such a (B) concentrated type, the volume is reduced commensurately with the degree of concentration, and it is thus possible to lower storage and transport costs.

The concentration rate is preferably at least 1.5-fold, more preferably at least 2-fold, even more preferably at least 3-fold, and especially preferably at least 5-fold. If the concentration rate is at least 1.5-fold, advantages for storage and transport will tend to be more easily obtained than when it is less than 1.5-fold. On the other hand, the concentration rate is preferably not greater than 40-fold, more preferably not greater than 20-fold, and even more preferably not greater than 15-fold. If the concentration rate is not greater than 40-fold, it will tend to be easier to inhibit aggregation of the abrasive grains than when it is greater than 40-fold.

When a (B) concentrated type of polishing liquid is used, the pH will differ before and after dilution with water. Thus, in order to prepare a polishing liquid with the same pH as an (A) normal type from a (B) concentrated type, the pH of the concentrated-type polishing liquid may be set slightly lower beforehand, in consideration of the pH increase by mixture with water. For example, when water containing dissolved-carbon dioxide (pH: approximately 5.6) is used for 10-fold dilution of a (B) concentrated-type polishing liquid at pH 4.0, the diluted polishing liquid will have a pH increased to about 4.3.

A (C) two-pack type has the advantage of allowing aggregation of the abrasive grains to be avoided in comparison with a (B) concentrated type, by appropriate separation into liquid A and liquid B. Any components may be added to liquid A and liquid B. For example, a slurry comprising abrasive grains and an acid or the like may be used as liquid A, while a solution comprising a metal ion and other components added as necessary may be used as liquid B. In this case, any acid or alkali is added to liquid A for adjustment of the pH in order to increase the dispersibility of the abrasive grains in liquid A.

A (C) two-pack type polishing liquid is useful in cases of combinations of components that, when mixed, tend to reduce the polishing properties in a relatively short period of time due to aggregation of the abrasive grains. From the viewpoint of reducing costs for storage and transport, either or both liquid A and liquid B may be concentrated types. In this case, liquid A, liquid B, water and the oxidizing agent may be mixed when the polishing liquid is to be used. The concentration rates and pH values for liquid A or liquid B may be as desired, so that the final mixture has liquid properties and polishing properties equivalent to those of an (A) normal type polishing liquid.

(Polishing Method)

By using the CMP polishing liquid described above, it is possible to accomplish polishing of substrates. Specifically, the polishing method of this embodiment comprises a step in which an abrasive cloth is placed opposite at a palladium layer side of a substrate having the palladium layer, and at least the palladium layer is polished with the abrasive cloth while supplying the CMP polishing liquid between the palladium layer and the abrasive cloth. The polishing method of this embodiment comprises at least a step of polishing a palladium layer, and a nickel layer or underlying metal layer may be simultaneously polished with the palladium layer, or a nickel layer or underlying metal layer may be successively polished with the palladium layer. When a nickel layer or underlying metal layer is to be simultaneously polished with a palladium layer, the nickel layer or underlying metal layer may be exposed together with the palladium layer at the surface to be polished.

When the polishing method of this embodiment is applied, preferably the surface to be polished is polished by, with a prescribed pressure being applied to the back side of the substrate (the side opposite to the surface to be polished)

to press the surface to be polished of the substrate against the abrasive cloth of the polishing platen, relatively moving the substrate and the polishing platen while supplying the CMP polishing liquid between the surface to be polished and the abrasive cloth.

The polishing apparatus used may be, for example, a common polishing apparatus comprising a platen which has a motor having a variable rotational speed and allows attachment of an abrasive cloth (pad), and a holder that holds the substrate. The abrasive cloth used may be a common nonwoven fabric, foamed polyurethane, a porous fluorine resin, or the like. The polishing conditions are preferably such that the rotational speed of the platen is low, at not higher than 200 rpm, to prevent fly off of the substrate.

The pressure applied to the substrate (the polishing pressure) is preferably 4-100 kPa, and it is more preferably 6-60 kPa from the viewpoint of uniformity within the substrate surface and flatness of the pattern. By using the CMP polishing liquid described above, it is possible to accomplish polishing of a palladium layer with a high polishing rate at a low polishing pressure. Polishing at a low polishing pressure is important from the viewpoint of preventing peeling of the layer to be polished, chipping, fragmentation and cracking, and achieving flatness of the pattern.

During the polishing, the CMP polishing liquid may be continuously supplied to the abrasive cloth with a pump or the like. The amount supplied is preferably an amount such that the surface of the abrasive cloth is covered by the CMP polishing liquid at all times. Upon completion of polishing, preferably, the substrate is thoroughly rinsed in running water, and it is dried after removing the water droplets adhering to the substrate by using a spin dryer or the like.

The palladium layer to be polished may be any layer containing palladium. The palladium content of the palladium layer will usually be in the range of 40-100 mass % and preferably 60-100 mass %, with respect to the total mass of the palladium layer.

Substrates that allow the effect of the CMP polishing liquid of this embodiment to be exhibited most prominently are substrates with palladium layers. The CMP polishing liquid of this embodiment may be suitably used even for substrates having at least an insulating film layer (interlayer dielectric film), a nickel layer and a palladium layer formed in that order on a semiconductor wafer such as a silicon wafer. An underlying metal layer may also be formed between the insulating film layer and the nickel layer.

The underlying metal layer is a layer that prevents diffusion of the conductive substance into the insulating film layer. The material used to form the underlying metal layer may be a tantalum compound such as tantalum, tantalum alloy or tantalum nitride; a ruthenium compound such as ruthenium, ruthenium alloy or ruthenium nitride; a titanium compound such as titanium, titanium alloy or titanium nitride; a cobalt compound such as cobalt, cobalt alloy or cobalt nitride; or a tungsten compound such as tungsten, tungsten alloy or tungsten nitride. The underlying metal layer may have a single-layer structure comprising one of these, or it may have a multilayer structure comprising two or more layers.

The insulating film layer may be at least one type selected from among inorganic insulating films such as $SiO_2$ films and SiN films, and Low-k films such as organosilicate glass and total aromatic ring-based Low-k films.

The polishing method using a CMP polishing liquid will now be explained in further detail with reference to the accompanying drawings. FIG. 1 is a cross-sectional view showing a first embodiment of the method for producing a substrate with bump electrodes, wherein the polishing method described above is applied for part of the steps in the production method.

The substrate 10 shown in FIG. 1(a) comprises a silicon substrate (silicon wafer) 1, an insulating film layer 2 with an irregular surface formed on the silicon substrate 1, and an under barrier metal layer 3 situated along the irregular surface of the insulating film layer 2 and covering the irregular surface. The under barrier metal layer 3 corresponds to the palladium layer. The under barrier metal layer 3 of the substrate 10 is polished using a CMP polishing liquid. Specifically, the under barrier metal layer 3 formed on the convexities of the insulating film layer 2 is polished with an abrasive cloth, while supplying the CMP polishing liquid comprising at least a metal salt, 1,2,4-triazole, a phosphorus acid, an oxidizing agent and abrasive grains, between the under barrier metal layer 3 and the abrasive cloth.

This polishing removes the under barrier metal layer 3 formed on the convexities of the insulating film layer 2, and exposes the convexities of the insulating film layer 2. FIG. 1(b) is a cross-sectional view showing a substrate obtained by such polishing.

Next, a resist pattern 4 is formed, by electrolytic plating or the like, on the convexities of the insulating film layer 2 from which the under barrier metal layer 3 has been removed, so that the under barrier metal layer 3 formed on the recesses of the insulating film layer 2 is exposed. FIG. 1(c) is a cross-sectional view showing a substrate on which a resist pattern 4 has been formed.

Next, bump electrodes 5 are formed on the recesses of the substrate on which the resist pattern 4 has been formed, so that they protrude from the surface of the insulating film layer 2. FIG. 1(d) is a cross-sectional view showing a substrate on which bump electrodes 5 have been formed. Finally, the resist pattern 4 is removed to obtain a substrate on which bump electrodes 5 have been formed on the silicon substrate 1. FIG. 1(e) is a cross-sectional view showing a substrate having bump electrodes 5 obtained as described above. The bump electrodes 5 are usually formed using a material such as gold, silver, copper, nickel or solder.

Figure 2:
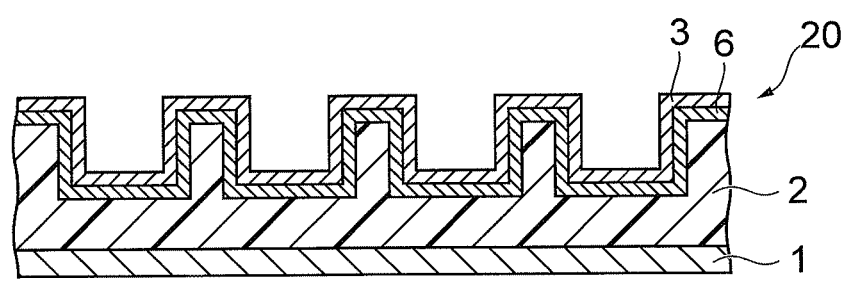
FIG. 2 is a cross-sectional view showing a second embodiment of a method for producing a substrate with bump electrodes.
Figure 2:
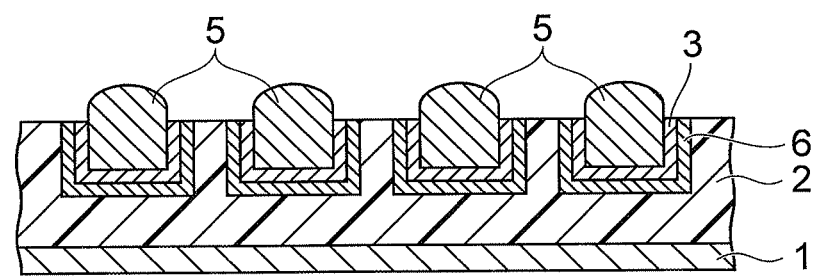

FIG. 2 is a cross-sectional view showing a second embodiment of the method for producing a substrate with bump electrodes, wherein the polishing method described above is applied for part of the steps in this production method as well. FIG. 2, however, shows only the substrate 20 before polishing (FIG. 2(a)) and the substrate with bump electrodes obtained as the final product (FIG. 2(b)), while the intervening steps of CMP polishing, resist pattern formation, bump electrode formation and resist pattern removal are carried out in the same manner as the first embodiment.

The substrate 20 shown in FIG. 2(a) comprises a silicon substrate 1, an insulating film layer 2 with an irregular surface formed on the silicon substrate 1, an underlying metal layer 6 situated along the irregular surface of the insulating film layer 2 and covering the irregular surface, and an under barrier metal layer 3 formed on the underlying metal layer 6 along the irregular surface of the insulating film layer 2.

The under barrier metal layer 3 corresponds to the palladium layer. The underlying metal layer 6 is formed for the purpose of inhibiting diffusion of the components of the under barrier metal layer 3 into the insulating film layer 2, and increasing adhesiveness between the insulating film layer 2 and the under barrier metal layer 3.

The under barrier metal layer 3 and underlying metal layer 6 of the substrate 20 are polished using a CMP polishing liquid. Specifically, the substrate 20 is polished with an abrasive cloth, while supplying the CMP polishing liquid comprising at least a metal salt, 1,2,4-triazole, a phosphorus acid, an oxidizing agent and abrasive grains, between the substrate 20 and the abrasive cloth, thereby polishing the under barrier metal layer 3 and underlying metal layer 6 formed on the convexities of the insulating film layer 2, with the abrasive cloth. This polishing removes the under barrier metal layer 3 and underlying metal layer 6 formed on the convexities of the insulating film layer 2, and exposes the convexities of the insulating film layer 2. Also, by resist pattern formation, bump electrode formation and resist pattern removal on the substrate obtained in this manner, as in the first embodiment, it is possible to obtain a substrate having bump electrodes 5 formed on the silicon substrate 1, as shown in FIG. 2(b).

Figure 3:
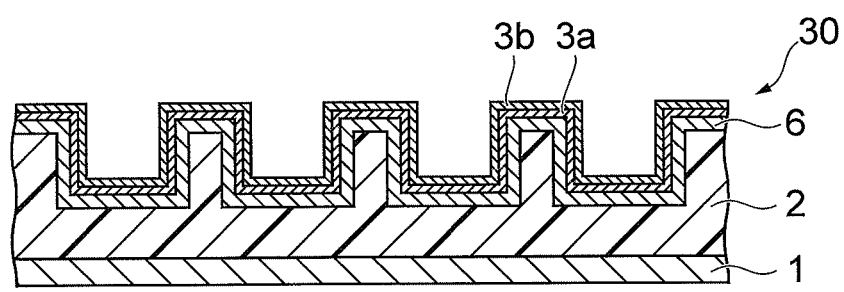
FIG. 3 is a cross-sectional view showing a third embodiment of a method for producing a substrate with bump electrodes.
Figure 3:
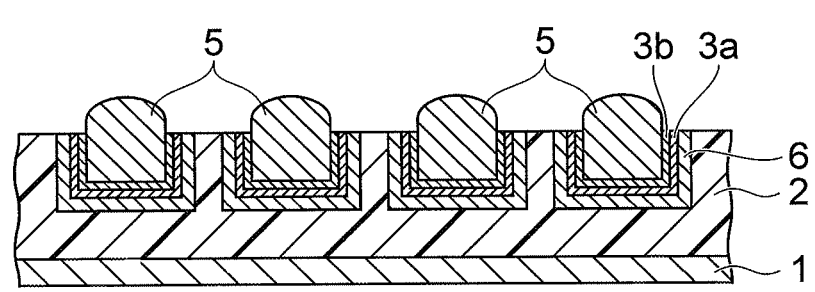

FIG. 3 is a cross-sectional view showing a third embodiment of the method for producing a substrate with bump electrodes, wherein the polishing method described above is applied for part of the steps in this production method as well. FIG. 3, however, shows only the substrate 30 before application of the polishing method (FIG. 3(a)) and the substrate with bump electrodes obtained as the final product (FIG. 3(b)), while the intervening steps of CMP polishing, resist pattern formation, bump electrode formation and resist pattern removal are carried out in the same manner as the first embodiment.

The substrate 30 shown in FIG. 3(a) comprises a silicon substrate 1, an insulating film layer 2 with an irregular surface formed on the silicon substrate 1, an underlying metal layer 6 situated along the irregular surface of the insulating film layer 2 and covering the irregular surface, a first under barrier metal layer 3a formed on the underlying metal layer 6 along the irregular surface of the insulating film layer 2, and a second under barrier metal layer 3b formed on the first under barrier metal layer 3a. The first under barrier metal layer 3a or second under barrier metal layer 3b corresponds to the palladium layer. The layer differing from the palladium layer, of the first under barrier metal layer 3a and second under barrier metal layer 3b, may be a nickel layer, for example.

The first under barrier metal layer 3a, second under barrier metal layer 3b and underlying metal layer 6 of the substrate 30 are polished using a CMP polishing liquid. Specifically, the substrate 30 is polished with an abrasive cloth, while supplying the CMP polishing liquid comprising at least a metal salt, 1,2,4-triazole, a phosphorus acid, an oxidizing agent and abrasive grains, between the substrate 30 and the abrasive cloth, thereby polishing the first under barrier metal layer 3a, second under barrier metal layer 3b and underlying metal layer 6 formed on the convexities of the insulating film layer 2, with the abrasive cloth. This polishing removes the first under barrier metal layer 3a, second under barrier metal layer 3b and underlying metal layer 6 formed on the convexities of the insulating film layer 2, and exposes the convexities of the insulating film layer 2. Also, by resist pattern formation, bump electrode formation and resist pattern removal on the substrate obtained in this manner, as in the first embodiment, it is possible to obtain a substrate having bump electrodes 5 formed on the silicon substrate 1, as shown in FIG. 3(b).

Figure 4:
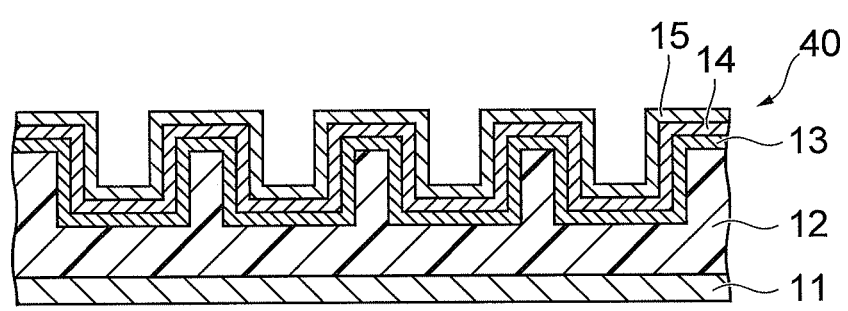
FIG. 4 is a cross-sectional view showing a specific example of the third embodiment.
Figure 4:
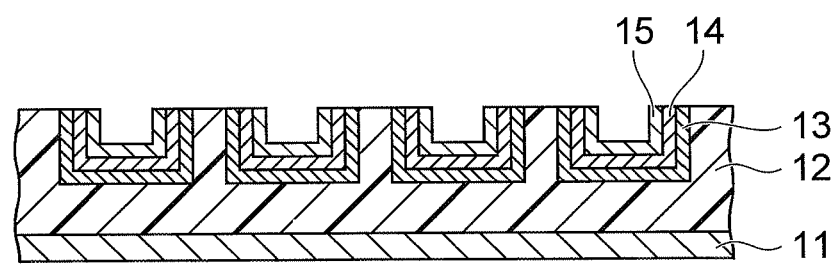

FIG. 4 shows an example wherein the first under barrier metal layer is a nickel layer and the second under barrier metal layer is a palladium layer in FIG. 3 (a structure comprising two under barrier metal layers).

The substrate 40 shown in FIG. 4(a) comprises an underlying metal layer 13, a nickel layer 14 and a palladium layer 15 formed in that order on the irregular surface of the insulating film layer 12 provided on the silicon substrate 11. The CMP polishing liquid may be used for polishing of the underlying metal layer 13, nickel layer 14 and palladium layer 15 to expose the convexities of the insulating film layer 12 as shown in FIG. 4(b).

Another embodiment of a polishing method using a CMP polishing liquid is a polishing method comprising a first polishing step in which the palladium layer 15 present on the convexities of the insulating film layer 12 of the substrate 40 is polished to expose the nickel layer 14, and a second polishing step in which the nickel layer 14 and underlying metal layer 13 present on the convexities of the insulating film layer 12, and the palladium layer 15 filling a portion of the recesses of the insulating film layer 12, are polished to expose the convexities of the insulating film layer 12. Of the first and second polishing steps, a CMP polishing liquid may be used in at least the first polishing step.

EXAMPLES

The present invention will now be explained by examples. However, the invention is not limited to these examples.

Experiment 1

(CMP Polishing Liquid Preparation Method)

The CMP polishing liquids used in Examples 1-15 and Comparative Examples 1-15 were prepared so as to comprise, based on the total mass of the CMP polishing liquid, 10 mass % of colloidal silica (mean primary particle size: 15 nm, mean secondary particle size: 43 nm, solid content (corresponding to abrasive grain content) of 20 mass %, PL-3, trade name of Fuso Chemical Co., Ltd.) as the abrasive grains, 0-0.088 mass % of the compounds listed in Tables 1 and 2 as metal salts (50 ppm as metal, where ppm is based on mass, same hereunder), 0-5 mass % of the compounds listed in Tables 1 and 2 as metal oxide solubilizers, 0-0.5 mass % of the compounds listed in Tables 1 and 2 as complexing agents, 10 mass % of 30% hydrogen peroxide water as an oxidizing agent, and purified water as the remainder. Each CMP polishing liquid was prepared by dissolving the components other than the abrasive grains in the purified water, and then mixing the abrasive grains therewith and stirring. The CMP polishing liquids were used for polishing of substrates to be polished under the following polishing conditions.

The CMP polishing liquid used in Comparative Example 16 was prepared so as to comprise, based on the total mass of the CMP polishing liquid, zinc sulfate containing 1.5 mmol/kg zinc (96 ppm as zinc), 3 mass % alumina abrasive grains comprising approximately 60 mass % α-alumina and approximately 40 mass % fumed alumina, and purified water as the remainder. The CMP polishing liquid used in Comparative Example 16 was prepared by dissolving the components other than the abrasive grains in the purified water, adjusting the pH to 3 with nitric acid, and then stirring for 5 minutes until uniform dispersion of the abrasive grains.

(Liquid Property Evaluation: pH Measurement)

Measuring temperature: 25±5° C.

Measuring apparatus: Model PHL-40 by DKK Corp.

Measuring method: Standard buffer (phthalate pH buffer: pH 4.01 (25° C.), neutral phosphate pH buffer: pH 6.86 (25° C.)) was used for 2-point calibration, and then an electrode was placed in the polishing liquid and the pH was measured with the measuring apparatus listed above, upon stabilization after an elapse of 2 minutes or more.

(CMP Polishing Conditions)
Polishing apparatus: Mirra (Applied Materials)
CMP polishing liquid flow rate: 200 mL/min
Polishing substrate: Substrate obtained by forming 0.3 nm-thick palladium layer on silicon substrate by sputtering
Abrasive cloth: Foamed polyurethane resin with closed cells (Model IC 1000, Rohm & Haas, Japan).
Polishing pressure: 29.4 kPa (4 psi)
Relative speed between substrate and polishing platen: 36 m/min
Polishing time: 1 minute
Cleaning: CMP treatment was followed by cleaning with ultrasonic water and drying with a spin dryer.

(Evaluation of Polished Products)
Polishing rate: The polishing rate for a palladium layer polished and cleaned under the conditions listed above (palladium polishing rate: PdRR) was determined by the following formula.

(PdRR)=(Difference in thickness of palladium layer (nm) before and after polishing)/(polishing time (min))

The difference in thickness of the palladium layer before and after polishing was determined by conversion of the electrical resistance value of the palladium layer.

The pH and palladium polishing rates of the CMP polishing liquids of Examples 1-15 and Comparative Examples 1-15 are shown in Table 1 and Table 2.

TABLE 1

|  | Metal oxide solubilizer (mass %) | Complexing agent (mass %) | Metal salt (mass %) | pH | PdRR (nm/min) |
| --- | --- | --- | --- | --- | --- |
| Example 1 | Phosphoric acid (5) | 1,2,4-Triazole (0.5) | $Fe(NO_3)_2 \cdot 9H_2O$ (0.026) | 1.5 | 78 |
| Example 2 | Phosphoric acid (5) | 1,2,4-Triazole (0.5) | $FeSO_4 \cdot 7H_2O$ (0.025) | 1.5 | 87 |
| Example 3 | Phosphoric acid (5) | 1,2,4-Triazole (0.5) | $Cu(NO_3)_2 \cdot 3H_2O$ (0.019) | 1.5 | 70 |
| Example 4 | Phosphoric acid (5) | 1,2,4-Triazole (0.5) | $CuSO_4$ (0.013) | 1.5 | 67 |
| Example 5 | Phosphoric acid (5) | 1,2,4-Triazole (0.5) | $AgNO_3$ (0.008) | 1.5 | 73 |
| Example 6 | Phosphoric acid (5) | 1,2,4-Triazole (0.5) | $Zn(NO_3)_2 \cdot 6H_2O$ (0.023) | 1.5 | 73 |
| Example 7 | Phosphoric acid (5) | 1,2,4-Triazole (0.5) | $ZnSO_4$ (0.013) | 1.5 | 74 |
| Example 8 | Phosphoric acid (5) | 1,2,4-Triazole (0.5) | $(CH_3COO)_2Zn$ (0.014) | 1.5 | 72 |
| Example 9 | Phosphoric acid (5) | 1,2,4-Triazole (0.5) | $Al(NO_3)_3 \cdot 9H_2O$ (0.070) | 1.5 | 85 |
| Example 10 | Phosphoric acid (5) | 1,2,4-Triazole (0.5) | $Al_2(SO_4)_3$ (0.058) | 1.5 | 72 |
| Example 11 | Phosphoric acid (5) | 1,2,4-Triazole (0.5) | $Al(C_3H_5O_3)_3$ (0.055) | 1.5 | 86 |
| Example 12 | Phosphoric acid (5) | 1,2,4-Triazole (0.5) | $AlK(SO_4)_2 \cdot 12H_2O$ (0.088) | 1.5 | 68 |
| Example 13 | Phosphoric acid (5) | 1,2,4-Triazole (0.5) | $AlNH_3(SO_4)_2 \cdot 12H_2O$ (0.084) | 1.5 | 70 |
| Example 14 | Phosphoric acid (5) | 1,2,4-Triazole (0.5) | $K_2Al_2O_4$ (0.018) | 1.5 | 71 |
| Example 15 | Phosphoric acid (5) | 1,2,4-Triazole (0.5) | $Ga(NO_3)_3 \cdot nH_2O$ (0.022) | 1.5 | 87 |

TABLE 2

|  | Metal oxide solubilizer (mass %) | Complexing agent (mass %) | Metal salt (mass %) | pH | PdRR (nm/min) |
| --- | --- | --- | --- | --- | --- |
| Comp. Example 1 | Phosphoric acid (5) | 1,2,4-Triazole (0.5) | — | 1.5 | 61 |
| Comp. Example 2 | Phosphoric acid (5) | 1,2,4-Triazole (0.5) | $Mg(NO_3)_2 \cdot 6H_2O$ (0.053) | 1.5 | 60 |
| Comp. Example 3 | Phosphoric acid (5) | 1,2,4-Triazole (0.5) | $MgSO_4$ (0.025) | 1.5 | 43 |
| Comp. Example 4 | Phosphoric acid (5) | 1,2,4-Triazole (0.5) | $Ca(NO_3)_2 \cdot 4H_2O$ (0.030) | 1.5 | 59 |
| Comp. Example 5 | Phosphoric acid (5) | 1,2,4-Triazole (0.5) | $(CH_3COO)_2Ca$ (0.020) | 1.5 | 60 |

TABLE 2-continued

| | Metal oxide solubilizer (mass %) | Complexing agent (mass %) | Metal salt (mass %) | pH | PdRR (nm/min) |
|---|---|---|---|---|---|
| Comp. Example 6 | Phosphoric acid (5) | 1,2,4-Triazole (0.5) | $Mn(NO_3)_2 \cdot 6H_2O$ (0.026) | 1.5 | 60 |
| Comp. Example 7 | Phosphoric acid (5) | 1,2,4-Triazole (0.5) | $Co(NO_3)_2 \cdot 6H_2O$ (0.025) | 1.5 | 63 |
| Comp. Example 8 | Phosphoric acid (5) | 1,2,4-Triazole (0.5) | $Ni(NO_3)_2 \cdot 6H_2O$ (0.025) | 1.5 | 62 |
| Comp. Example 9 | Oxalic acid (5) | — | — | 1.1 | 2 |
| Comp. Example 10 | Glycolic acid (5) | — | — | 2.0 | 2 |
| Comp. Example 11 | Phosphoric acid (5) | — | — | 1.4 | 4 |
| Comp. Example 12 | — | 1,2,4-Triazole (0.5) | — | 6.5 | 0.2 |
| Comp. Example 13 | Phosphoric acid (5) | 1,2,3-Triazole (0.5) | — | 1.5 | 0 |
| Comp. Example 14 | Phosphoric acid (5) | 3-Amino-1,2,4-triazole (0.5) | $Fe(NO_3)_2 \cdot 9H_2O$ (0.026) | 2.1 | 4 |
| Comp. Example 15 | Nitric acid (5) | 1,2,4-Triazole (0.5) | — | 1.2 | 0.5 |

The pH of the CMP polishing liquid of Comparative Example 16 was 3.0, and the palladium polishing rate was 4 nm/min.

The results shown in Table 1 and Table 2 will now be explained in detail. For preparation of the CMP polishing liquid in Example 1, the metal salt was 0.026 mass % iron(II) nitrate.$9H_2O$ (50 ppm as iron, $9.0 \times 10^{-4}$ mol per 1 kg CMP polishing liquid), the metal oxide solubilizer was 5 mass % phosphoric acid, and the complexing agent was 0.5 mass % 1,2,4-triazole. The palladium polishing rate in Example 1 was 78 nm/min, which was a higher value than in Comparative Examples 1-15

For preparation of the CMP polishing liquid in Example 2, the metal salt was 0.025 mass % iron(II) sulfate.$7H_2O$ (50 ppm as iron, $9.0 \times 10^{-4}$ mol per 1 kg CMP polishing liquid), the metal oxide solubilizer was 5 mass % phosphoric acid, and the complexing agent was 0.5 mass % 1,2,4-triazole. The palladium polishing rate in Example 2 was 87 nm/min, which was a higher value than in Comparative Examples 1-15.

For preparation of the CMP polishing liquid in Example 3, the metal salt was 0.019 mass % copper nitrate.$3H_2O$ (50 ppm as copper, $7.9 \times 10^{-4}$ mol per 1 kg CMP polishing liquid), the metal oxide solubilizer was 5 mass % phosphoric acid, and the complexing agent was 0.5 mass % 1,2,4-triazole. The palladium polishing rate in Example 3 was 70 nm/min, which was a higher value than in Comparative Examples 1-15.

For preparation of the CMP polishing liquid in Example 4, the metal salt was 0.013 mass % copper sulfate (50 ppm as copper, $7.9 \times 10^{-4}$ mol per 1 kg CMP polishing liquid), the metal oxide solubilizer was 5 mass % phosphoric acid, and the complexing agent was 0.5 mass % 1,2,4-triazole. The palladium polishing rate in Example 4 was 67 nm/min, which was a higher value than in Comparative Examples 1-15.

For preparation of the CMP polishing liquid in Example 5, the metal salt was 0.008 mass % silver nitrate (50 ppm as silver, $4.6 \times 10^{-4}$ mol per 1 kg CMP polishing liquid), the metal oxide solubilizer was 5 mass % phosphoric acid, and the complexing agent was 0.5 mass % 1,2,4-triazole. The palladium polishing rate in Example 5 was 73 nm/min, which was a higher value than in Comparative Examples 1-15.

For preparation of the CMP polishing liquid in Example 6, the metal salt was 0.023 mass % zinc nitrate.$6H_2O$ (50 ppm as zinc, $7.6 \times 10^{-4}$ mol per 1 kg CMP polishing liquid), the metal oxide solubilizer was 5 mass % phosphoric acid, and the complexing agent was 0.5 mass % 1,2,4-triazole. The palladium polishing rate in Example 6 was 73 nm/min, which was a higher value than in Comparative Examples 1-15.

For preparation of the CMP polishing liquid in Example 7, the metal salt was 0.013 mass % zinc sulfate (50 ppm as zinc, $7.6 \times 10^{-4}$ mol per 1 kg CMP polishing liquid), the metal oxide solubilizer was 5 mass % phosphoric acid, and the complexing agent was 0.5 mass % 1,2,4-triazole. The palladium polishing rate in Example 7 was 74 nm/min, which was a higher value than in Comparative Examples 1-15.

For preparation of the CMP polishing liquid in Example 8, the metal salt was 0.014 mass % zinc acetate (50 ppm as zinc, $7.6 \times 10^{-4}$ mol per 1 kg CMP polishing liquid), the metal oxide solubilizer was 5 mass % phosphoric acid, and the complexing agent was 0.5 mass % 1,2,4-triazole. The palladium polishing rate in Example 8 was 72 nm/min, which was a higher value than in Comparative Examples 1-15.

For preparation of the CMP polishing liquid in Example 9, the metal salt was 0.070 mass % aluminum nitrate.$9H_2O$ (50 ppm as aluminum, $1.9 \times 10^{-3}$ mol per 1 kg CMP polishing liquid), the metal oxide solubilizer was 5 mass % phosphoric acid, and the complexing agent was 0.5 mass % 1,2,4-triazole. The palladium polishing rate in Example 9 was 85 nm/min, which was a higher value than in Comparative Examples 1-15.

For preparation of the CMP polishing liquid in Example 10, the metal salt was 0.058 mass % aluminum sulfate (50 ppm as aluminum, $1.9 \times 10^{-3}$ mol per 1 kg CMP polishing liquid), the metal oxide solubilizer was 5 mass % phosphoric acid, and the complexing agent was 0.5 mass % 1,2,4-triazole. The palladium polishing rate in Example 10 was 72 nm/min, which was a higher value than in Comparative Examples 1-15.

For preparation of the CMP polishing liquid in Example 11, the metal salt was 0.055 mass % aluminum lactate (50 ppm as aluminum, $1.9 \times 10^{-3}$ mol per 1 kg CMP polishing liquid), the metal oxide solubilizer was 5 mass % phosphoric acid, and the complexing agent was 0.5 mass % 1,2,4- triazole. The palladium polishing rate in Example 11 was 86 nm/min, which was a higher value than in Comparative Examples 1-15.

For preparation of the CMP polishing liquid in Example 12, the metal salt was 0.088 mass % potassium aluminum alum (50 ppm as aluminum, $1.9 \times 10^{-3}$ mol per 1 kg CMP polishing liquid), the metal oxide solubilizer was 5 mass % phosphoric acid, and the complexing agent was 0.5 mass % 1,2,4-triazole. The palladium polishing rate in Example 12 was 68 nm/min, which was a higher value than in Comparative Examples 1-15.

For preparation of the CMP polishing liquid in Example 13, the metal salt was 0.084 mass % ammonium aluminum alum (50 ppm as aluminum, $1.9 \times 10^{-3}$ mol per 1 kg CMP polishing liquid), the metal oxide solubilizer was 5 mass % phosphoric acid, and the complexing agent was 0.5 mass % 1,2,4-triazole. The palladium polishing rate in Example 13 was 70 nm/min, which was a higher value than in Comparative Examples 1-15.

For preparation of the CMP polishing liquid in Example 14, the metal salt was 0.018 mass % potassium aluminate (50 ppm as aluminum, $1.9 \times 10^{-3}$ mol per 1 kg CMP polishing liquid), the metal oxide solubilizer was 5 mass % phosphoric acid, and the complexing agent was 0.5 mass % 1,2,4-triazole. The palladium polishing rate in Example 14 was 71 nm/min, which was a higher value than in Comparative Examples 1-15.

For preparation of the CMP polishing liquid in Example 15, the metal salt was 0.022 mass % gallium nitrate.$nH_2O$ (50 ppm as gallium, $7.2 \times 10^{-4}$ mol per 1 kg CMP polishing liquid), the metal oxide solubilizer was 5 mass % phosphoric acid, and the complexing agent was 0.5 mass % 1,2,4-triazole. The palladium polishing rate in Example 15 was 87 nm/min, which was a higher value than in Comparative Examples 1-15.

In Comparative Examples 11 and 13, the CMP polishing liquid comprised phosphoric acid as the metal oxide solubilizer, but the palladium polishing rate was confirmed to be extremely low. Also, although the palladium polishing rate was improved by adding 1,2,4-triazole as a complexing agent in addition to phosphoric acid, as in Comparative Example 1, it was lower than in Examples 1-15.

The CMP polishing liquid used in Comparative Example 16 was a CMP polishing liquid according to Example 3F of Patent document 9, which included zinc ion. The palladium polishing rate in Comparative Example 16 was lower than in Examples 1-15.

In Examples 1-15, on the other hand, adding a specific metal salt in addition to the phosphoric acid and 1,2,4-triazole used in Comparative Example 1 allowed the palladium polishing rate to be further improved.

Experiment 2

The CMP polishing liquids used in Example 7, Example 11 and Comparative Example 11 were used for polishing of the substrates specified below, and it was confirmed that the polishing liquids of the invention can polish metals other than palladium. The polishing was carried out and the polishing rates were determined in the same manner as Experiment 1, except for changing the substrates to be polished to those shown below.

Nickel substrate: Substrate obtained by forming 0.3 μm-thick nickel layer on silicon substrate.
Tantalum substrate: Substrate obtained by forming 0.3 μm-thick tantalum nitride layer on silicon substrate.
Titanium substrate: Substrate obtained by forming 0.3 μm-thick titanium layer on silicon substrate.
Cobalt substrate: Substrate obtained by forming 0.3 μm-thick cobalt layer on silicon substrate.
Ruthenium substrate: Substrate obtained by forming 0.3 μm-thick ruthenium layer on silicon substrate.

The measurement results for the polishing rates on each substrate are shown in Table 3. The evaluation results using the CMP polishing liquids of Example 7, Example 11 and Comparative Example 11 are shown as Example 7-2, Example 11-2 and Comparative Example 11-2, respectively. In Table 3, NiRR represents the polishing rate for the nickel layer, TaNRR represents the polishing rate for the tantalum nitride layer, TiRR represents the polishing rate for the titanium layer, CoRR represents the polishing rate for the cobalt layer, and RuRR represents the polishing rate for the ruthenium layer.

TABLE 3

|  | NiRR (nm/min) | TaNRR (nm/min) | TiRR (nm/min) | CoRR (nm/min) | RuRR (nm/min) |
| --- | --- | --- | --- | --- | --- |
| Example 7-2 | 690 | 156 | 94 | 120 | 22 |
| Example 11-2 | 720 | 161 | 93 | 92 | 22 |
| Comp. Ex. 11-2 | 560 | 160 | 96 | 130 | 20 |

As is clear from Table 3, the nickel layer polishing rate was a prescribed polishing rate even without a metal salt, but was further improved by including a metal salt. The ruthenium layer polishing rate was slightly improved by including a metal salt. The tantalum nitride layer polishing rate, titanium layer polishing rate and cobalt layer polishing rate had prescribed polishing rates even without a metal salt, and were virtually unchanged by addition of a metal salt.

The CMP polishing liquids of Examples 1-6, 8-10 and 12-15 were also used to polish a substrate obtained by forming a nickel layer on silicon substrate and a substrate obtained by forming a tantalum nitride layer on silicon substrate, and polishing was possible at an excellent polishing rate. This confirmed that the CMP polishing liquid of the invention allows satisfactory polishing of an under barrier metal layer such as a nickel layer and an underlying metal layer such as a tantalum nitride layer, in addition to a palladium layer. Thus, the CMP polishing liquid of the invention can be used for the step of polishing a substrate comprising an underlying metal layer 13, a nickel layer 14 and a palladium layer 15, as shown in FIG. 4(*a*), to obtain the structure shown in FIG. 4(*b*).

REFERENCE SIGNS LIST

1, 11: Silicon substrates, 2, 12: insulating film layers, 3: under barrier metal layer, 3*a*: first under barrier metal layer, 3*b*: second under barrier metal layer, 4: resist pattern, 5: bump electrode, 6, 13: underlying metal layers, 14: nickel layer, 15: palladium layer, 10, 20, 30, 40: substrates.

The invention claimed is:
1. A CMP polishing liquid, for polishing a metal, comprising:
a metal salt containing at least one type of metal selected from the group consisting of silver and metals of

Groups 12 and 13,
1,2,4-triazole,
phosphoric acid,
hydrogen peroxide, and
abrasive grains,
wherein a content of the metal salt is $2\times10^{-4}$ to 5 mol per kg of the CMP polishing liquid, a content of 1,2,4-triazole is 0.05-10 mass % based on the total mass of the CMP polishing liquid, a content of phosphoric acid is 0.02-10 mass % based on the total mass of the CMP polishing liquid, a content of hydrogen peroxide is 0.1-10 mass % based on the total mass of the CMP polishing liquid, and a content of the abrasive grains is 0.2-8 mass % based on a total mass of the CMP polishing liquid.

2. The CMP polishing liquid according to claim 1, wherein the abrasive grains include at least one type selected from the group consisting of alumina, silica, zirconia, titania and ceria.

3. The CMP polishing liquid according to claim 1, which is for polishing of a palladium layer.

4. The CMP polishing liquid according to claim 1, wherein the metal salt is selected from the group consisting of aluminum chloride, aluminum sulfate, aluminum acetate, aluminum lactate, potassium aluminum alum, ammonium aluminum alum, potassium aluminate, sodium aluminate, and a metal salt containing silver.

5. The CMP polishing liquid according to claim 1, wherein 1,2,4-triazole coordinates with the metal to be polished to form a complex.

6. A polishing method comprising a step of polishing at least a palladium layer with a polishing cloth while supplying a CMP polishing liquid between the palladium layer of a substrate and the polishing cloth,
wherein the CMP polishing liquid comprises a metal salt containing at least one type of metal selected from the group consisting of silver and metals of Groups 12 and 13, 1,2,4-triazole, phosphoric acid, hydrogen peroxide and abrasive grains,
a content of the metal salt is $2\times10^{-4}$ to 5 mol per kg of the CMP polishing liquid, a content of 1,2,4-triazole is 0.05-10 mass % based on the total mass of the CMP polishing liquid, a content of phosphoric acid is 0.02-10 mass % based on the total mass of the CMP polishing liquid, a content of hydrogen peroxide is 0.1-10 mass % based on the total mass of the CMP polishing liquid, and a content of the abrasive grains is 0.2-8 mass % based on a total mass of the CMP polishing liquid.

7. The polishing method according to claim 6, wherein the abrasive grains include at least one type selected from the group consisting of alumina, silica, zirconia, titania and ceria.

8. The polishing method according to claim 6, wherein the metal salt is selected from the group consisting of aluminum chloride, aluminum sulfate, aluminum acetate, aluminum lactate, potassium aluminum alum, ammonium aluminum alum, potassium aluminate, sodium aluminate, and a metal salt containing silver.

9. The polishing method according to claim 6, wherein 1,2,4-triazole coordinates with palladium of the palladium layer to form a complex.

10. A CMP polishing liquid comprising:
a metal salt containing at least one type of metal selected from the group consisting of metals of Groups 8, 11, 12 and 13,
1,2,4-triazole,
phosphoric acid,
hydrogen peroxide and abrasive grains, wherein
pH of the CMP polishing liquid is not greater than 5, and
a content of the metal salt is $2\times10^{-4}$ to 5 mol per kg of the CMP polishing liquid, a content of 1,2,4-triazole is 0.05-10 mass % based on the total mass of the CMP polishing liquid, a content of phosphoric acid is 0.02-10 mass % based on the total mass of the CMP polishing liquid, a content of hydrogen peroxide is 0.1-10 mass % based on the total mass of the CMP polishing liquid, and a content of the abrasive grains is 0.2-8 mass % based on a total mass of the CMP polishing liquid.

11. The CMP polishing liquid according to claim 10, wherein the abrasive grains include at least one type selected from the group consisting of alumina, silica, zirconia, titania and ceria.

12. The CMP polishing liquid according to claim 10, which is for polishing of a palladium layer.

13. The CMP polishing liquid according to claim 10, wherein the metal salt is selected from the group consisting of aluminum chloride, aluminum sulfate, aluminum acetate, aluminum lactate, potassium aluminum alum, ammonium aluminum alum, potassium aluminate, sodium aluminate, and a metal salt containing silver.

14. The CMP polishing liquid according to claim 10, wherein 1,2,4-triazole coordinates with the metal to be polished to form a complex.

15. A polishing method comprising a step of polishing at least a palladium layer with a polishing cloth while supplying a CMP polishing liquid between the palladium layer of a substrate and the polishing cloth,
wherein the CMP polishing liquid comprises a metal salt containing at least one type of metal selected from the group consisting of metals of Groups 8, 11, 12 and 13, 1,2,4-triazole, phosphoric acid, hydrogen peroxide and abrasive grains,
pH of the CMP polishing liquid is not greater than 5,
a content of the metal salt is $2\times10^4$ to 5 mol per kg of the CMP polishing liquid, a content of 1,2,4-triazole is 0.05-10 mass % based on the total mass of the CMP polishing liquid, a content of phosphoric acid is 0.02-10 mass % based on the total mass of the CMP polishing liquid, a content of hydrogen peroxide is 0.1-10 mass % based on the total mass of the CMP polishing liquid, and a content of the abrasive grains is 0.2-8 mass % based on a total mass of the CMP polishing liquid.

16. The polishing method according to claim 15, wherein the abrasive grains include at least one type selected from the group consisting of alumina, silica, zirconia, titania and ceria.

17. The polishing method according to claim 15, wherein the metal salt is selected from the group consisting of aluminum chloride, aluminum sulfate, aluminum acetate, aluminum lactate, potassium aluminum alum, ammonium aluminum alum, potassium aluminate, sodium aluminate, and a metal salt containing silver.

18. The polishing method according to claim 15, wherein 1,2,4-triazole coordinates with palladium of the palladium layer to form a complex.

19. A polishing method comprising the steps of:
preparing a substrate having at least a palladium layer and a metal layer selected from the group consisting of a nickel layer, a tantalum layer and a cobalt layer;
polishing at least the palladium layer and the metal layer with a polishing cloth while supplying a CMP polishing liquid between a side of the palladium layer of the substrate and the polishing cloth, and wherein the CMP polishing liquid comprises a metal salt containing at least one type of metal selected from the group consisting of metals of Groups 8, 11, 12 and 13, 1,2,4-triazole, phosphoric acid, hydrogen peroxide and abrasive grains, a content of the metal salt is $2\times10^{-4}$ to 5 mol per kg of the CMP polishing liquid, a content of 1,2,4-triazole is 0.05-10 mass % based on the total mass of the CMP polishing liquid, a content of phosphoric acid is 0.02-10 mass % based on the total mass of the CMP polishing liquid, a content of hydrogen peroxide is 0.1-10 mass % based on the total mass of the CMP polishing liquid, and a content of the abrasive grains is 0.2-8 mass % based on a total mass of the CMP polishing liquid.

20. The polishing method according to claim 19, wherein the abrasive grains include at least one type selected from the group consisting of alumina, silica, zirconia, titania and ceria.

21. The polishing method according to claim 19, wherein the metal salt is selected from the group consisting of aluminum chloride, aluminum sulfate, aluminum acetate, aluminum lactate, potassium aluminum alum, ammonium aluminum alum, potassium aluminate, sodium aluminate, and a metal salt containing silver.

22. The polishing method according to claim 19, wherein 1,2,4-triazole coordinates with palladium of the palladium layer to form a complex.

* * * * *